(12) United States Patent
Sforzin et al.

(10) Patent No.: US 12,080,350 B2
(45) Date of Patent: Sep. 3, 2024

(54) BALANCING DATA IN MEMORY

(71) Applicant: Micron Technology, Inc., Boise, ID (US)

(72) Inventors: Marco Sforzin, Cernusco Sul Naviglio (IT); Riccardo Muzzetto, Arcore (IT)

(73) Assignee: Micron Technology, Inc., Boise, ID (US)

( * ) Notice: Subject to any disclaimer, the term of this patent is extended or adjusted under 35 U.S.C. 154(b) by 198 days.

(21) Appl. No.: 17/890,912

(22) Filed: Aug. 18, 2022

(65) Prior Publication Data
US 2024/0062824 A1  Feb. 22, 2024

(51) Int. Cl.
| G11C 11/00 | (2006.01) |
| G11C 16/08 | (2006.01) |
| G11C 16/10 | (2006.01) |
| G11C 16/26 | (2006.01) |

(52) U.S. Cl.
CPC ............ *G11C 16/102* (2013.01); *G11C 16/08* (2013.01); *G11C 16/26* (2013.01)

(58) Field of Classification Search
CPC .................................................. G11C 13/0002
USPC ......................................................... 365/148
See application file for complete search history.

(56) References Cited

U.S. PATENT DOCUMENTS

| 11,177,009 | B2 | 11/2021 | Hirst et al. |
| 11,315,633 | B2 | 4/2022 | Castro et al. |
| 2021/0342090 | A1* | 11/2021 | Laurent ................. G06F 3/0602 |

OTHER PUBLICATIONS

U.S. Appl. No. 17/712,948, entitled, "Unbalanced Programmed Data States in Memory," filed Apr. 4, 2022, 27 pages.
U.S. Appl. No. 17/222,660, entitled, "Fixed Weight Codewords for Ternary Memory Cells," filed Apr. 5, 2021, 67 pages.

* cited by examiner

*Primary Examiner* — Hoai V Ho
(74) *Attorney, Agent, or Firm* — Brooks, Cameron & Huebsch, PLLC

(57) ABSTRACT

The present disclosure includes apparatuses, methods, and systems for balancing data in memory. An embodiment includes a memory having a group of memory cells, wherein each respective memory cell is programmable to one of three possible data states, and circuitry to balance data programmed to the group between the three possible data states by determining whether the data programmed to the group is balanced for any one of the three possible data states, and upon determining the data programmed to the group is not balanced for any one of the three possible data states apply a rotational mapping algorithm to the data programmed to the group until the data is balanced for any one of the three possible data states and apply a Knuth algorithm to the data of the group programmed to the two of the three possible data states that were not balanced by the rotational mapping algorithm.

26 Claims, 5 Drawing Sheets

BALANCING DATA IN MEMORY

TECHNICAL FIELD

The present disclosure relates generally to semiconductor memory and methods, and more particularly, to balancing data in memory.

BACKGROUND

Memory devices are typically provided as internal, semiconductor, integrated circuits and/or external removable devices in computers or other electronic devices. There are many different types of memory including volatile and non-volatile memory. Volatile memory can require power to maintain its data and can include random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), and resistance variable memory such as phase change random access memory (PCRAM), resistive random access memory (RRAM), magnetic random access memory (MRAM), and programmable conductive memory, among others.

Memory devices can be utilized as volatile and non-volatile memory for a wide range of electronic applications in need of high memory densities, high reliability, and low power consumption. Non-volatile memory may be used in, for example, personal computers, portable memory sticks, solid state drives (SSDs), digital cameras, cellular telephones, portable music players such as MP3 players, and movie players, among other electronic devices.

Resistance variable memory devices can include resistance variable memory cells that can store data based on the resistance state of a storage element (e.g., a memory element having a variable resistance). As such, resistance variable memory cells can be programmed to store data corresponding to a target data state by varying the resistance level of the memory element. Resistance variable memory cells can be programmed to a target data state (e.g., corresponding to a particular resistance state) by applying sources of an electrical field or energy, such as positive or negative electrical pulses (e.g., positive or negative voltage or current pulses) to the cells (e.g., to the memory element of the cells) for a particular duration. A state of a resistance variable memory cell can be determined by sensing current through the cell responsive to an applied interrogation voltage. The sensed current, which varies based on the resistance level of the cell, can indicate the state of the cell.

Various memory arrays can be organized in a cross-point architecture with memory cells (e.g., resistance variable cells) being located at intersections of a first and second signal lines used to access the cells (e.g., at intersections of word lines and bit lines). Some resistance variable memory cells can comprise a select element (e.g., a diode, transistor, or other switching device) in series with a storage element (e.g., a phase change material, metal oxide material, and/or some other material programmable to different resistance levels). Some resistance variable memory cells, which may be referred to as self-selecting memory cells, can comprise a single material which can serve as both a select element and a storage element for the memory cell.

DETAILED DESCRIPTION

Figure 1:
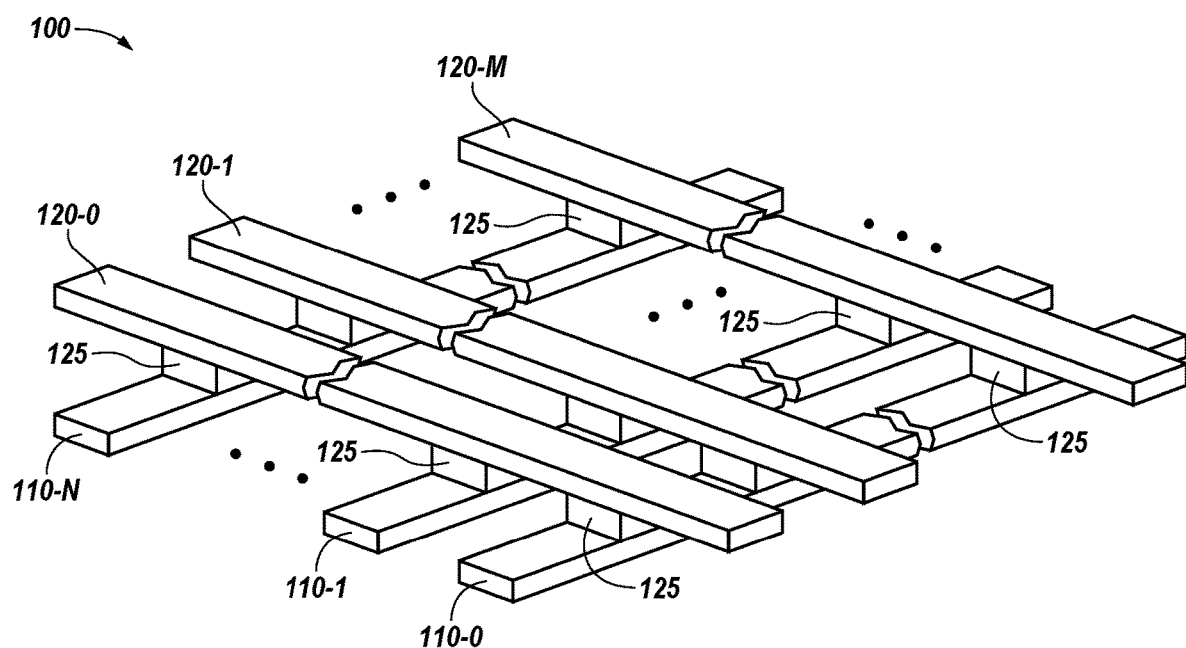
FIG. 1 is a three-dimensional view of an example of a memory array, in accordance with an embodiment of the present disclosure.

The present disclosure includes apparatuses, methods, and systems for balancing data in memory. An embodiment includes a memory having a group of memory cells, wherein each respective memory cell is programmable to one of three possible data states, and circuitry to balance data programmed to the group between the three possible data states by determining whether the data programmed to the group is balanced for any one of the three possible data states, and upon determining the data programmed to the group is not balanced for any one of the three possible data states apply a rotational mapping algorithm to the data programmed to the group until the data is balanced for any one of the three possible data states and apply a Knuth algorithm to the data of the group programmed to the two of the three possible data states that were not balanced by the rotational mapping algorithm.

As discussed further herein, a resistance variable memory cell, such as a self-selecting memory cell, can be programmable to one of three different data states, and a sense operation can be performed on the cell to determine the data state to which the cell has been programmed. Further, a memory device can address such memory cells (e.g., resistance variable memory cells) for operations (e.g., sense and program operations) in groups (e.g., packets) called words or codewords.

As memory cells are sensed and programmed, their response to positive or negative electrical pulses can change cycle after cycle (e.g., according to a specific electrical bias history of the code/word to which they belong). Some memory devices can track memory cell variations (e.g., due to being sensed and programmed) by averaging the signals of a codeword. As such, data can be converted into a balanced codeword. Signals of the balanced codeword can be averaged to generate an appropriate reference signal for that entire codeword. That reference signal can be provided to sense amplifiers for sense operations, which can compare a memory cell signal to the reference signal.

For example, when performing a sense operation (e.g., a read operation), a memory device may access a memory cell, which may output a signal to sense circuitry that can correspond to the data state of the memory cell (e.g., to a value stored by the memory cell). To determine the data state of the memory cell, the sense circuitry may compare the signal output by the memory cell to the reference signal, which may be, for instance, a reference voltage. The reference voltage may correspond to a voltage positioned between an expected voltage level of the signal output by a memory cell programmed to a first one of the data states (e.g., storing a first logic value) and an expected voltage level of the signal output by a memory cell programmed to a second one of the data states (e.g., storing a second logic value), or to a voltage positioned between an expected voltage level of the signal output by a memory cell programmed to the second one of the data states and an expected voltage level of the signal output by a memory cell programmed to a third one of the data states (e.g., storing a third logic value). For instance, in the first reference voltage example of the previous sentence, the sense circuitry may determine that the memory cell has been programmed to the first one of the data states if the signal output by the memory cell is less than the reference voltage, and that the memory cell has been programmed to the second one of the data states if the signal output by the memory cell is greater than the reference voltage.

If, however, the threshold voltage distributions associated with the data states of the memory cells of the codeword do not have equivalent widths and/or heights (e.g., if the data of the codeword is not balanced), then averaging the signals of the codeword may not provide an appropriate reference signal for that codeword. For instance, using the average signal as the reference signal for such an unbalanced codeword may result in cells of the codeword being sensed to be in states to which they were not actually programmed (e.g., a cell programmed to be in the first one of the data states may be erroneously sensed to be in the second one of the data states, and/or vice versa). Such erroneous data sensing can reduce the performance and/or lifetime of the memory.

Embodiments of the present disclosure, however, can effectively balance the data of a codeword, such that the average signal of the codeword can be adjusted to provide an appropriate reference signal that will not result in the data states of the cells of the codeword being erroneously sensed. Accordingly, embodiments of the present disclosure can increase the performance and/or lifetime of memory that utilizes codewords. For instance, embodiments of the present disclosure can effectively balance the data of a codeword that comprises memory cells (e.g., resistance variable memory cells) that are programmable to one of at least three different data states. In contrast, previous approaches may only be capable of balancing the data of a codeword that comprises memory cells that are programmable to one of only two different data states.

As used herein, "a", "an", or "a number of" can refer to one or more of something, and "a plurality of" can refer to two or more such things. For example, a memory device can refer to one or more memory devices, and a plurality of memory devices can refer to two or more memory devices.

The figures herein follow a numbering convention in which the first digit or digits correspond to the drawing figure number and the remaining digits identify an element or component in the drawing. Similar elements or components between different figures may be identified by the use of similar digits.

FIG. 1 is a three-dimensional view of an example of a memory array 100 (e.g., a cross-point memory array), in accordance with an embodiment of the present disclosure. Memory array 100 may include a plurality of first signal lines (e.g., first access lines), which may be referred to as word lines 110-0 to 110-N, and a plurality of second signal lines (e.g., second access lines), which may be referred to as bit lines 120-0 to 120-M that cross each other (e.g., intersect in different planes). For example, each of word lines 110-0 to 110-N may cross bit lines 120-0 to 120-M. A memory cell 125 may be between the bit line and the word line (e.g., at each bit line/word line crossing).

The memory cells 125 may be programmable to one of three different data states, as will be further described further herein. Further, a group of the memory cells 125 can comprise a codeword, which can refer to a logical unit of a memory device used to store data. Such three-state programming can be useful in supporting complex memory operations, such as, for instance, machine learning applications, in which data is encoded and matching functions or partial matching functions (e.g., Hamming distances) are computed. For instance, such three-state programming can support the computation of the matching function or partial matching function of an input vector pattern with many stored vectors in an efficient manner.

The memory cells 125 may be resistance variable memory cells, for example. The memory cells 125 may include a material programmable to different data states (e.g., a set state, a reset state, or a "T" state). In some examples, each of memory cells 125 may include a single material, between a top electrode (e.g., top plate) and a bottom electrode (e.g., bottom plate), that may serve as a select element (e.g., a switching material) and a storage element, so that each memory cell 125 may act as both a selector device and a memory element. Such a memory cell may be referred to herein as a self-selecting memory cell. For example, each memory cell may include a chalcogenide material that may be formed of various doped or undoped materials, that may or may not be a phase-change material, and/or that may or may not undergo a phase change during reading and/or writing the memory cell. Chalcogenide materials may be materials or alloys that include at least one of the elements S, Se, and Te. Chalcogenide materials may include alloys of S, Se, Te, Ge, As, Al, Sb, Au, indium (In), gallium (Ga), tin (Sn), bismuth (Bi), palladium (Pd), cobalt (Co), oxygen (O), silver (Ag), nickel (Ni), platinum (Pt). Example chalcogenide materials and alloys may include, but are not limited to, Ge—Te, In—Se, Sb—Te, Ga—Sb, In—Sb, As—Te, Al—Te, Ge—Sb—Te, Te—Ge—As, In—Sb—Te, Te—Sn—Se, Ge—Se—Ga, Bi—Se—Sb, Ga—Se—Te, Sn—Sb—Te, In—Sb—Ge, Te—Ge—Sb—S, Te—Ge—Sn—0, Te—Ge—Sn—Au, Pd—Te—Ge—Sn, In—Se—Ti—Co, Ge—Sb—Te—Pd, Ge—Sb—Te—Co, Sb—Te—Bi—Se, Ag—In—Sb—Te, Ge—Sb—Se—Te, Ge—Sn—Sb—Te, Ge—Te—Sn—Ni, Ge—Te—Sn—Pd, or Ge—Te—Sn—Pt. Example chalcogenide materials can also include SAG-based glasses NON phase change materials such as SeAsGe. The hyphenated chemical composition notation, as used herein, indicates the elements included in a particular compound or alloy and is intended to represent all stoichiometries involving the indicated elements. For example, Ge—Te may include GexTey, where x and y may be any positive integer.

In various embodiments, the threshold voltages of memory cells 125 may snap back in response to a magnitude of an applied voltage differential across them exceeding their threshold voltages. Such memory cells may be referred to as snapback memory cells. For example, a memory cell 125 may change (e.g., snap back) from a non-conductive (e.g., high impedance) state to a conductive (e.g., lower impedance) state in response to the applied voltage differential exceeding the threshold voltage. For example, a memory cell snapping back may refer to the memory cell transitioning from a high impedance state to a lower impedance state responsive to a voltage differential applied across the memory cell being greater than the threshold voltage of the memory cell. A threshold voltage of a memory cell snapping back may be referred to as a snapback event, for example.

The architecture of memory array 100 may be referred to as a cross-point architecture in which a memory cell is formed at a topological cross-point between a word line and a bit line as illustrated in FIG. 1. Such a cross-point architecture may offer relatively high-density data storage with lower production costs compared to other memory architectures. For example, the cross-point architecture may have memory cells with a reduced area and, resultantly, an increased memory cell density compared to other architectures.

Embodiments of the present disclosure, however, are not limited to the example memory array architecture illustrated in FIG. 1. For example, embodiments of the present disclosure can include a three-dimensional memory array having a plurality of vertically oriented (e.g., vertical) access lines and a plurality of horizontally oriented (e.g., horizontal) access lines. The vertical access lines can be bit lines arranged in a pillar-like architecture, and the horizontal access lines can be word lines arranged in a plurality of conductive planes or decks separated (e.g., insulated) from each other by a dielectric material. The chalcogenide material of the respective memory cells of such a memory array can be located at the crossing of a respective vertical bit line and horizontal word line.

Further, in some architectures (not shown), a plurality of first access lines may be formed on parallel planes or tiers parallel to a substrate. The plurality of first access lines may be configured to include a plurality of holes to allow a plurality of second access lines formed orthogonally to the planes of first access lines, such that each of the plurality of second access lines penetrates through a vertically aligned set of holes (e.g., the second access lines vertically disposed with respect to the planes of the first access lines and the horizontal substrate). Memory cells including a storage element (e.g., self-selecting memory cells including a chalcogenide material) may be formed at the crossings of first access lines and second access lines (e.g., spaces between the first access lines and the second access lines in the vertically aligned set of holes). In a similar fashion as described above, the memory cells (e.g., self-selecting memory cells including a chalcogenide material) may be operated (e.g., read and/or programmed) by selecting respective access lines and applying voltage or current pulses.

Figure 2A:
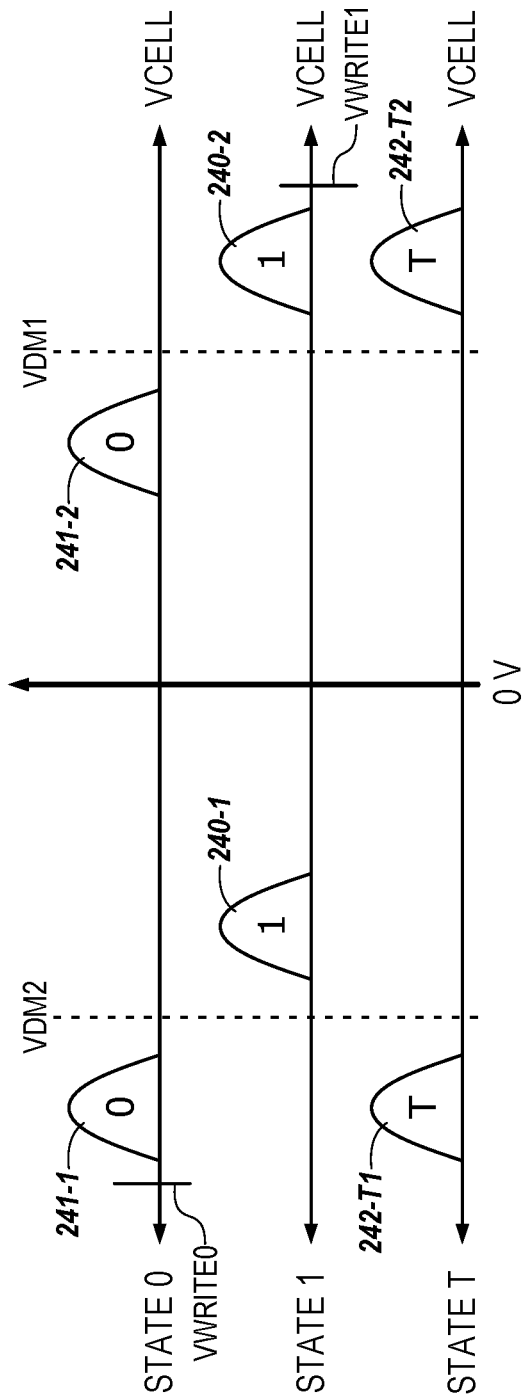
FIG. 2A illustrates threshold voltage distributions associated with various states of memory cells, in accordance with an embodiment of the present disclosure.

FIG. 2A illustrates threshold distributions associated with various states of memory cells, such as memory cells 125 illustrated in FIG. 1, in accordance with an embodiment of the present disclosure. For instance, as shown in FIG. 2A, the memory cells can be programmed to one of three possible data states (e.g., a first data state 0, a second state 1, or a third state T). That is, FIG. 2A illustrates threshold voltage distributions associated with three possible data states to which the memory cells can be programmed.

In FIG. 2A, the voltage VCELL may correspond to a voltage differential applied to (e.g., across) the memory cell, such as the difference between a bit line voltage (VBL) and a word line voltage (VWL) (e.g., VCELL=VBL−VWL). The threshold voltage distributions (e.g., ranges) 240-1, 240-2, 241-1, 241-2, 242-T1, and 242-T2 may represent a statistical variation in the threshold voltages of memory cells programmed to a particular state. The distributions illustrated in FIG. 2A correspond to the current versus voltage curves described further in conjunction with FIGS. 2B and 2C, which illustrate snapback asymmetry associated with assigned data states.

Figure 2B:
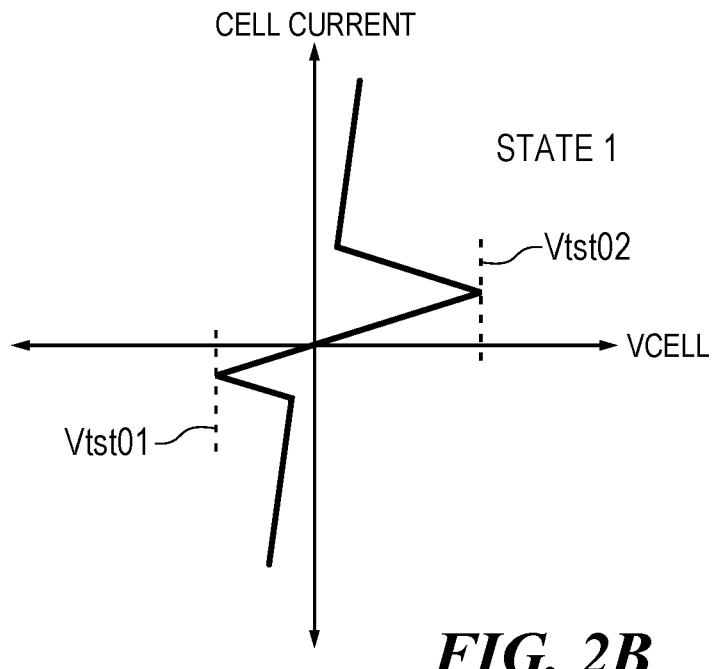
FIG. 2B is an example of a current-versus-voltage curve corresponding to a memory state of FIG. 2A, in accordance with an embodiment of the present disclosure.
Figure 2C:
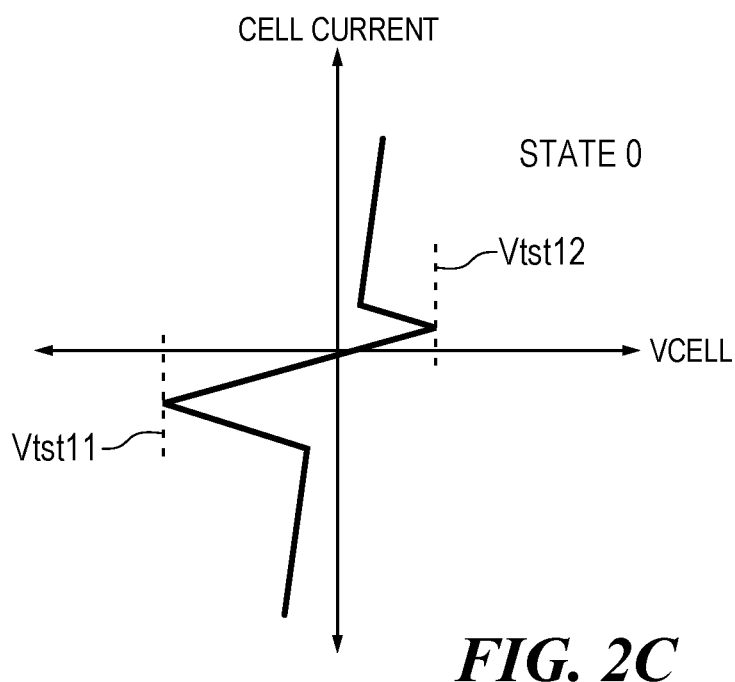
FIG. 2C is an example of a current-versus-voltage curve corresponding to another memory state of FIG. 2A, in accordance with an embodiment of the present disclosure.

In some examples, the magnitudes of the threshold voltages of a memory cell 125 in a particular state may be asymmetric for different polarities, as shown in FIGS. 2A, 2B and 2C. For example, the threshold voltage of a memory cell 125 programmed to state 0 or state 1 may have a different magnitude in one polarity than in an opposite polarity. For instance, in the example illustrated in FIG. 2A, a first data state (e.g., state 0) is associated with a first asymmetric threshold voltage distribution (e.g., threshold voltage distributions 241-1 and 241-2) whose magnitude is greater for a negative polarity than a positive polarity, and a second data state (e.g., state 1) is associated with a second asymmetric threshold voltage distribution (e.g., threshold voltage distributions 240-1 and 240-2) whose magnitude is greater for a positive polarity than a negative polarity. In such an example, an applied voltage magnitude sufficient to cause a memory cell 125 to snap back can be different (e.g., higher or lower) for one applied voltage polarity than the other.

In some examples, the magnitudes of the threshold voltages of a memory cell 125 in a particular state may be symmetric for different polarities, as shown in FIG. 2A. For example, the threshold voltage of a memory cell 125 programmed to state T may have the same magnitude in opposite polarities. For instance, in the example illustrated in FIG. 2A, a third data state (e.g., state T) is associated with a symmetric threshold voltage distribution (e.g., threshold voltage distributions 242-T1 and 242-T2) whose magnitude is substantially equal (e.g. high) for both a positive polarity and a negative polarity. In such an example, an applied voltage magnitude sufficient to cause a memory cell 125 to snap back can be the same for different applied voltage polarities.

FIG. 2A illustrates demarcation voltages VDM1 and VDM2, which can be used to determine the state of a memory cell (e.g., to distinguish between states as part of a read operation). In this example, VDM1 is a positive voltage used to distinguish cells in state 0 (e.g., in threshold voltage distribution 241-2) from cells in state 1 (e.g., threshold voltage distribution 240-2) or state T (e.g., threshold voltage distribution 242-T2). Similarly, VDM2 is a negative voltage used to distinguish cells in state 1 (e.g., threshold voltage distribution 240-1) from cells in state 0 (e.g., threshold voltage distribution 241-1) or state T (e.g., threshold voltage distribution 242-T1). In the examples of FIGS. 2A-2C, a memory cell 125 in a positive state 1 or T does not snap back in response to applying VDM1; a memory cell 125 in a positive state 0 snaps back in response to applying VDM1; a memory cell 125 in a negative state 1 snaps back in response to applying VDM2; and a memory cell 125 in a negative state 0 or T does not snap back in response to applying VDM2.

Embodiments are not limited to the example shown in FIG. 2A. For example, the designations of state 0 and state 1 can be interchanged (e.g., distributions 241-1 and 241-2 can be designated as state 1 and distributions 240-1 and 240-2 can be designated as state 0).

FIGS. 2B and 2C are examples of current-versus-voltage curves corresponding to the memory states of FIG. 2A, in accordance with an embodiment of the present disclosure. As such, in this example, the curves in FIGS. 2B and 2C correspond to cells in which state 1 is designated as the higher threshold voltage state in a particular polarity (positive polarity direction in this example), and in which state 0 is designated as the higher threshold voltage state in the opposite polarity (negative polarity direction in this example). As noted above, the state designation can be interchanged such that state 0 could correspond to the higher threshold voltage state in the positive polarity direction with state 1 corresponding to the higher threshold voltage state in the negative direction.

FIGS. 2B and 2C illustrate memory cell snapback as described herein. VCELL can represent an applied voltage across the memory cell. For example, VCELL can be a voltage applied to a top electrode corresponding to the cell minus a voltage applied to a bottom electrode corresponding to the cell (e.g., via a respective word line and bit line). As shown in FIG. 2B, responsive to an applied positive polarity voltage (VCELL), a memory cell programmed to state 1 (e.g., threshold voltage distribution 240-2) is in a non-conductive state until VCELL reaches voltage Vtst02, at which point the cell transitions to a conductive (e.g., lower resistance) state. This transition can be referred to as a snapback event, which occurs when the voltage applied across the cell (in a particular polarity) exceeds the cell's threshold voltage. Accordingly, voltage Vtst02 can be referred to as a snapback voltage. In FIG. 2B, voltage Vtst01 corresponds to a snapback voltage for a cell programmed to state 1 (e.g., threshold voltage distribution 240-1). That is, as shown in FIG. 2B, the memory cell transitions (e.g., switches) to a conductive state when VCELL exceeds Vtst01 in the negative polarity direction.

Similarly, as shown in FIG. 2C, responsive to an applied negative polarity voltage (VCELL), a memory cell programmed to state 0 (e.g., threshold voltage distribution 241-1) is in a non-conductive state until VCELL reaches voltage Vtst11, at which point the cell snaps back to a conductive (e.g., lower resistance) state. In FIG. 2C, voltage Vtst12 corresponds to the snapback voltage for a cell programmed to state 0 (e.g., threshold voltage distribution 241-2). That is, as shown in FIG. 2C, the memory cell snaps back from a high impedance non-conductive state to a lower impedance conductive state when VCELL exceeds Vtst12 in the positive polarity direction.

In various instances, a snapback event can result in a memory cell switching states. For instance, if a VCELL exceeding Vtst02 is applied to a state 1 cell, the resulting snapback event may reduce the threshold voltage of the cell to a level below VDM1, which would result in the cell being read as state 0 (e.g., threshold voltage distribution 241-2). As such, in a number of embodiments, a snapback event can be used to write a cell to the opposite state (e.g., from state 1 to state 0 and vice versa).

Figure 3A:
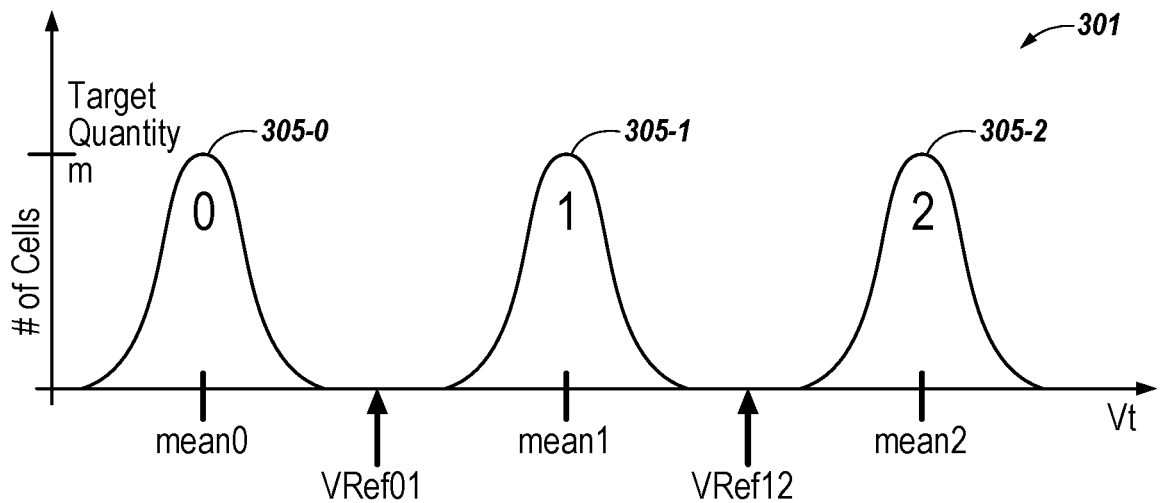
FIG. 3A illustrates a diagram of a number of threshold voltage distributions, sensing voltages, and data assignments associated with a group of memory cells in accordance with an embodiment of the present disclosure.
Figure 3B:
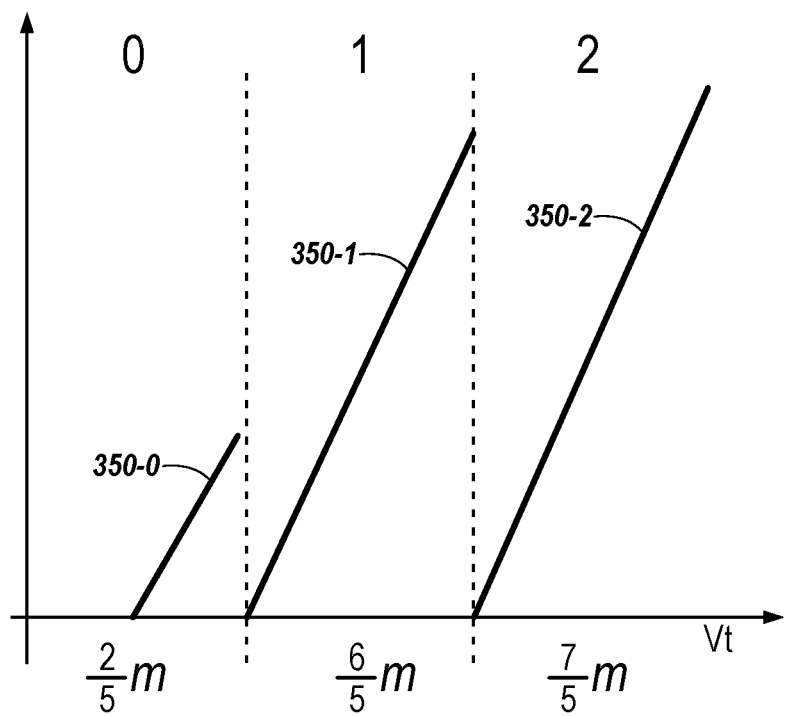
FIG. 3B illustrates a conceptual example of threshold voltage distributions associated with the data states of a group of memory cells in accordance with an embodiment of the present disclosure.

FIG. 3A illustrates a diagram of a number of threshold voltage (Vt) distributions, sensing voltages, and data assignments associated with a group (e.g., codeword) of memory cells, such as memory cells 125 illustrated in FIG. 1, in accordance with an embodiment of the present disclosure. FIG. 3B illustrates a conceptual example of Vt distributions associated with the data states of a group (e.g., codeword) of memory cells, such as memory cells 125 illustrated in FIG. 1, in accordance with an embodiment of the present disclosure. FIG. 3A illustrates a diagram 301 of Vt distributions 305-0, 305-1, and 305-2 associated with the data states of the memory cells of a first codeword, and FIG. 3B illustrates Vt distributions 350-0, 350-1, and 350-2 associated with a second codeword.

Vt distributions 305-0, 305-1, and 305-2 shown in FIG. 3A, and Vt distributions 350-0, 350-1, and 350-2 shown in FIG. 3B, represent three target data states (e.g., 0, 1, and 2, respectively) to which the memory cells of the group can be programmed. As an example, threshold voltage distributions 305-2 and 350-2 can be associated with a first (e.g., reset) data state, threshold voltage distributions 305-0 and 350-0 can be associated with a second (e.g., set) data state, and threshold voltage distributions 305-1 and 305-2 can be associated with a third (e.g., T) data state. Embodiments of the present disclosure, however, are not limited to these data assignments.

Vt distributions 305-0, 305-1, and 305-2 shown in FIG. 3A, and Vt distributions 350-0, 350-1, and 350-2 shown in FIG. 3B, can represent a quantity (e.g., number) of memory cells of the group that are programmed to the corresponding target states (e.g., 0, 1, and 2), with the height of a Vt distribution curve in FIG. 3A indicating the quantity of cells programmed to a particular voltage within the Vt distribution (e.g., on average), and the length of a Vt distribution curve in FIG. 3B indicating the quantity of cells programmed to its corresponding target state. The width of the Vt distribution curve in FIG. 3A indicates the range of voltages that represent a particular target state (e.g., the width of Vt distribution curve 305-0 represents the range of voltages that correspond to a data value of 0 for the first codeword).

In the example illustrated in FIG. 3A (e.g., the first codeword), the widths and heights of Vt distributions 305-0, 305-1, and 305-2 are equivalent (e.g., equal). For instance, the quantity of memory cells of the first codeword that are programmed to each respective data state is the target quantity m. As such, the first codeword (e.g., the data states of the memory cells of the first codeword) can be considered to be balanced. In contrast, in the example illustrated in FIG. 3B (e.g., the second codeword), the lengths of Vt distributions 350-0, 350-1, and 350-2 are not equivalent (e.g., are different). For instance, the lengths of Vt distributions 350-0, 350-1, and 350-2 (e.g., the quantity of memory cells of the second codeword that are programmed to data states 0, 1, and 2) are (2/5)m, (6/5)m, and (7/5)m, respectively. As such, the second codeword (e.g., the data states of the memory cells of the second codeword) can be considered to be unbalanced.

During a sense (e.g., read) operation to determine the respective data states stored by the memory cells of the group, a reference voltage located between two of the Vt distributions can be used to distinguish between the data states. For example, VRef01 illustrated in FIG. 3A can be used to distinguish between data states 0 and 1, and VRef02 illustrated in FIG. 3A can be used to distinguish between data states 1 and 2. The data state for a memory cell being sensed can be determined using (e.g., by comparing) reference voltage and the voltage signal from that memory cell during the sense operation.

In the examples illustrated in FIGS. 3A and 3B, the reference voltages (e.g., VRef01 and VRef12) used to distinguish between the data states can be determined by averaging the threshold voltages of the memory cells of the group (e.g., illustrated as mean0, mean1, and mean2 in FIG. 3A). For the first codeword (e.g., the balanced codeword whose Vt distribution widths and heights are equivalent), these reference voltages would be located exactly between its Vt distributions 305-0 and 305-1, and exactly between its Vt distributions 305-1 and 305-2, as illustrated in FIG. 3A. However, for the second codeword (e.g., the unbalanced codeword whose Vt distribution lengths are not equivalent), these reference voltages would not be located exactly between its Vt distributions 350-0 and 350-1, or exactly between its Vt distributions 350-1 and 350-2. As such, using these reference voltages to sense the data states of the memory cells of the second codeword may result in some cells of that codeword being erroneously sensed to be in a state to which they were not actually programmed to.

Embodiments of the present disclosure, however, can balance the data programmed to a codeword, such that the average threshold voltage of the memory cells of the codeword, and therefore the reference voltages used to sense the data states of the memory cells, can be located between (e.g., exactly between) Vt distributions 350-0 and 350-1, and between (e.g., exactly between) Vt distributions 350-1 and 350-2. Using such an adjusted reference voltage can result in the data states of the cells of the codeword not being erroneously sensed.

Figure 4:
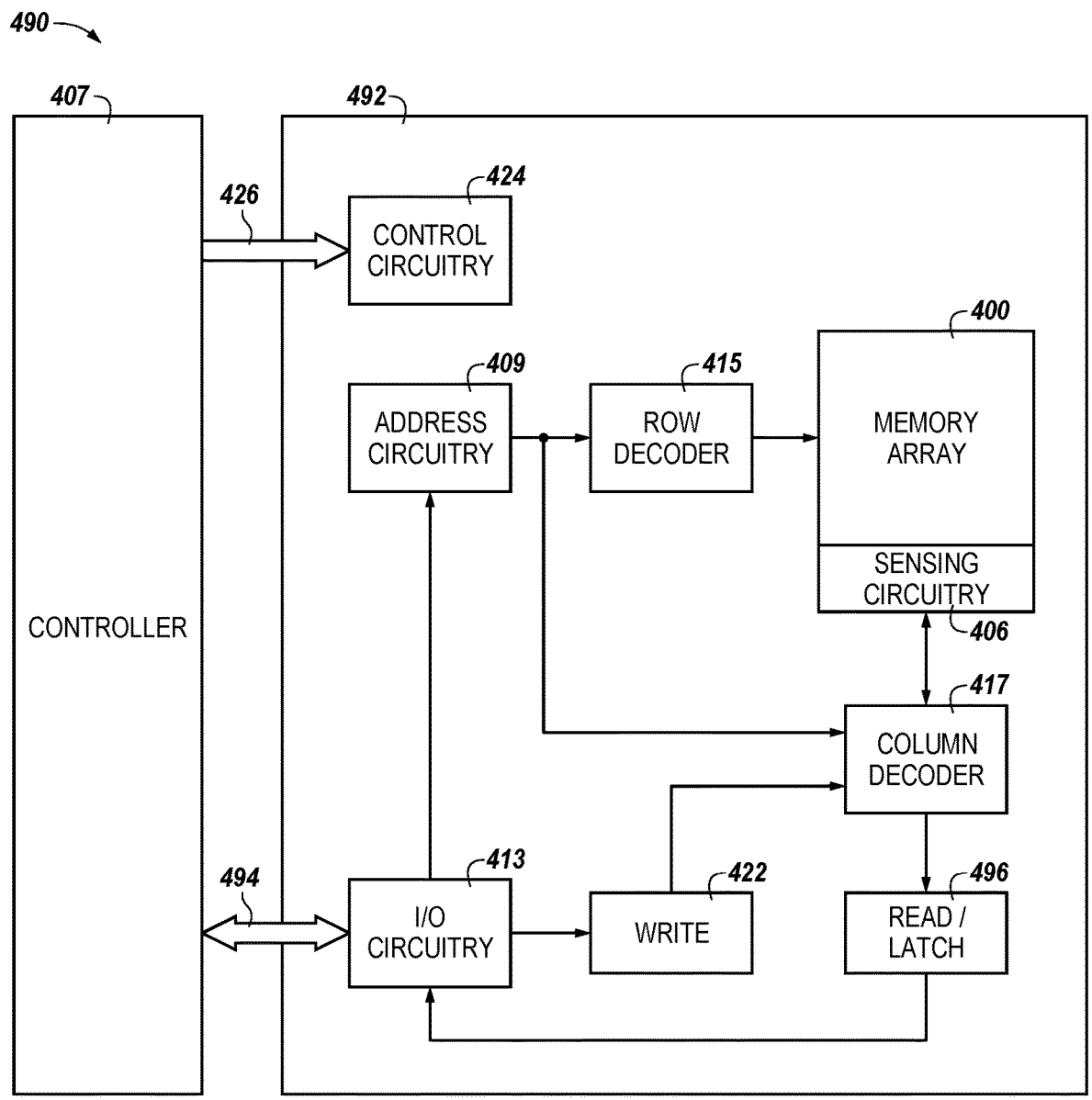
FIG. 4 is a block diagram illustration of an example apparatus, in accordance with an embodiment of the present disclosure.

FIG. 4 is a block diagram illustration of an example apparatus, such as an electronic memory system 490, in accordance with an embodiment of the present disclosure. Memory system 490 may include an apparatus, such as a memory device 492 and a controller 407, such as a memory controller (e.g., a host controller). Controller 407 might include a processor, for example. Controller 407 might be coupled to a host, for example, and may receive command signals (or commands), address signals (or addresses), and data signals (or data) from the host and may output data to the host.

Memory device 492 includes a memory array 400 of memory cells. Memory array 400 can be, for instance, memory array 100 previously described in connection with FIG. 1. For example, memory array 400 can include a group of memory cells, such as a codeword, wherein each respective memory cell of the group is programmable (e.g., has been programmed) to one of three possible data states, as previously described herein. Although one memory array 400 is illustrated in FIG. 4 for simplicity and so as not to obscure embodiments of the present disclosure, memory device 492 can include a number of memory arrays analogous to array 400.

Memory device 492 may include address circuitry 409 to latch address signals provided over I/O connections 494 through I/O circuitry 413. Address signals may be received and decoded by a row decoder 415 and a column decoder 417 to access the memory array 400. For example, row decoder 415 and/or column decoder 417 may include drivers.

Memory device 492 may sense (e.g., read) data in memory array 400 by using sense/buffer circuitry that in some examples may be read/latch circuitry 496. Read/latch circuitry 496 may read and latch data from the memory array 400. Sensing circuitry 406 may include a number of sense amplifiers coupled to memory cells of memory array 400, which may operate in combination with the read/latch circuitry 496 to sense (e.g., read) memory states from targeted memory cells. I/O circuitry 413 may be included for bi-directional data communication over the I/O connections 494 with controller 407. Write circuitry 422 may be included to write data to memory array 400.

Control circuitry 424 may decode signals provided by control connections 426 from controller 407. These signals may include chip signals, write enable signals, and address latch signals that are used to control the operations on memory array 400, including data read and data write operations.

Control circuitry 424 may be included in controller 407, for example. Controller 407 may include other circuitry, firmware, software, or the like, whether alone or in combination. Controller 407 may be an external controller (e.g., in a separate die from the memory array 400, whether wholly or in part) or an internal controller (e.g., included in a same die as the memory array 400). For example, an internal controller might be a state machine or a memory sequencer.

In some examples, controller 407 can balance the data programmed to a group of memory cells (e.g., a codeword) of memory array 406. Accordingly, the reference voltages used to sense the data states of the memory cells can be located between (e.g., exactly between) the Vt distributions associated with the group, as previously described herein.

For example, controller 407 can balance the data by first determining whether the data programmed to the group of memory cells is balanced for any one of the three possible data states (e.g., data states 0, 1, and 2 previously described in connection with FIGS. 3A and 3B) to which the cells can be programmed. For instance, controller 407 can determine whether the quantity of the data of the group that is programmed to any one of the three possible data states is at a target quantity (e.g., a target weight), such as target quantity m previously described in connection with FIGS. 3A and 3B. If the quantity of the data of the group of memory cells programmed to each respective one of the three possible data states is not at the target quantity, it can be determined that the data programmed to the group is not balanced for any one of the three possible data states. If, however, the quantity of the data of the group of memory cells programmed to any one of the three possible data states is at the target quantity, it can be determined that the data programmed to the group is balanced for that data state.

Upon determining that the data programmed to the group of memory cells is not balanced for any one of the three possible data states, controller 407 can apply a rotational mapping algorithm (e.g., a permutation of symbols) to the data programmed to the group of memory cells. For instance, the rotational mapping algorithm can be applied to a portion (e.g., a subsequence) of the codeword. The rotational mapping algorithm can rotate the data states of the codeword (e.g., of the portion of the codeword) until the data of the codeword is balanced for any one of the three possible data states. For instance, the rotational mapping algorithm can be a solitary algorithm, a minimum-maximum algorithm, or a free-choice algorithm, which will be further described herein.

For example, if it is determined that the data programmed to the group of memory cells is not balanced for any one of the three possible data states, then it can be determined (e.g., it follows) that the quantity of the data of the group that is programmed to a first one of the three possible data states is less than the target quantity (e.g., less than m), the quantity of the data of the group that is programmed to a second one of the three possible data states is greater than the target quantity (e.g., greater than m), and the quantity of the data of the group that is programmed to a third one of the three possible data states is either less than or greater than the target quantity (e.g., such that the weight of a single one of the three possible data states is either less than or greater than m). Accordingly, the rotational mapping algorithm can change the quantity of the data of the group programmed to the first one of the three possible data states to be greater than the target quantity if the quantity of the data of the group programmed to the third one of the three possible data states is determined to be greater than the target quantity (e.g., if the first data state is the single data state), and the rotational mapping algorithm can change the quantity of the data of the group programmed to the second one of the three possible data states to be less than the target quantity of the quantity of the data of the group programmed to the third one of the three possible data states is determined to be less than the target quantity (e.g., if the second data state is the single data state).

Controller 407 can then apply a Knuth algorithm to the data of the group of memory cells (e.g., to the portion of the codeword to which the rotational mapping algorithm was applied) programmed to the two of the three possible data states that were not balanced by the rotational mapping algorithm, which can balance those two remaining unbalanced data states. As such, the data of the group (e.g., the codeword) can be balanced.

Upon determining that the data programmed to the group of memory cells is balanced for any one of the three possible data states (e.g., prior to applying the rotational mapping algorithm), controller 407 can apply the Knuth algorithm to the data of the group programmed to the two of the three possible data states that were not determined to be balanced. That is, if it is determined that that the data programmed to the group of memory cells is already balanced for any one of the three possible data states prior to the rotational mapping algorithm being applied to the data, controller 407 can skip the rotational mapping algorithm and apply only the Knuth algorithm.

Controller 407 can store, in memory array 400 (e.g., not as part of the codeword) the quantity of the data of the group of memory cells that is changed (e.g., how many bits in the codeword are rotated, inverted, or shifted) during the balancing of the data. For instance, controller 407 can store, in memory array 400, the data state that is the single one of the three possible data states whose weight is less than or greater than m, an index of the rotational mapping algorithm (e.g., indicating the portion of the codeword to which the rotational mapping algorithm was applied), and an index of the Knuth algorithm (e.g., indicating the portion of the codeword to which the Knuth algorithm was applied). This information can be referred to herein as parity data.

Controller 407 can subsequently decode the balanced data (e.g., recover the original codeword) using the stored quantity (e.g., using the parity data). For example, controller 407 can use the parity data to apply an inversion of the rotational mapping algorithm to the balanced data to decode the balanced data and recover the original codeword. Examples of decoding the balanced data will be further described herein.

In an example in which the rotational mapping algorithm is a solitary algorithm, applying the solitary algorithm to the data programmed to the group of memory cells can comprise applying an operator to a first portion of the data programmed to the group of memory cells (e.g., to a first quantity of the data values of the codeword). Applying the operator to the first portion of the data can change the data of the first portion that is in a first one of the three possible data states to a second one of the three possible data states, can change the data of the first portion that is in the second one of the three possible data states to a third one of the three possible data states, and can change the data of the first portion that is in the third one of the three possible data states to the first one of the three possible data states. For instance, each occurrence of data state 0 in the first portion can be changed to data state 1, each occurrence of data state 1 in the first portion can be changed to data state 2, and each occurrence of data state 2 in the first portion can be changed to 0.

After the operator of the solitary algorithm is applied to the first portion of the data, it can be determined whether the data is balanced for any one of the three possible data states. Determining whether the data is balanced for any one of the three possible data states can comprise, for example, determining whether the target quantity m is between a lower (e.g., minimum) of a quantity of the data in the first data state and a quantity of the data in the third data state and a greater (e.g., maximum) of the quantity of the data in the first data state and the quantity of the data in the third data state, determining whether the target quantity is between a lower of the quantity of the data in the first data state and a quantity of the data in the second data state and a greater of the quantity of the data in the first data state and the quantity of the data in the second data state, and determining whether the target quantity is between a lower of the quantity of the data in the second data state and the quantity of the data in the third data state and a greater of the quantity of the data in the second data state and the quantity of the data in the third data state. If the target quantity is determined to be between the lower of the quantity of the data in the first data state and the quantity of the data in the third data state and the greater of the quantity of the data in the first data state and the quantity of the data in the third data state, then the data can be determined to be balanced for the first data state. If the target quantity is determined to be between the lower of the quantity of the data in the first data state and the quantity of the data in the second data state and the greater of the quantity of the data in the first data state and the quantity of the data in the second data state, then the data can be determined to be balanced for the second data state. If the target quantity is determined to be between the lower of the quantity of the data in the second data state and the quantity of the data in the third data state and the greater of the quantity of the data in the second data state and the quantity of the data in the third data state, then the data can be determined to be balanced for the second data state. It is noted that it is possible for the data to be determined to be balanced for more than one of the three data states; in such an instance, one of these data states can be selected to be the balanced data state.

If it is determined that the data is balanced for any one of the three possible data states after the operator of the solitary algorithm is applied to the first portion of the data, the Knuth algorithm can be applied to the data of the group programmed to the two of the three possible data states that were not balanced after the operator was applied to the first portion of the data. If it is determined the data is not balanced for any of the three possible data states, the operator of the solitary algorithm can be applied to a second portion of the data programmed to the group of memory cells (e.g., to a second quantity of the data values of the codeword). Applying the operator to the second portion of the data can change the data of the second portion that is in the first one of the three possible data states to the second one of the three possible data states, can change the data of the second portion that is in the second one of the three possible data states to the third one of the three possible data states, and can change the data of the second portion that is in the third one of the three possible data states to the first one of the three possible data states (e.g., in a manner analogous to that previously described for the first portion of the data).

After the operator of the solitary algorithm is applied to the second portion of the data, it can be determined whether the data is balanced for any one of the three possible data states, in a manner analogous to that previously described for the first portion of the data. If it is determined that the data is balanced for any one of the three possible data states after the operator of the solitary algorithm is applied to the second portion of the data, the Knuth algorithm can be applied to the data of the group programmed to the two of the three possible data states that were not balanced after the operator was applied to the second portion of the data. If it is determined the data is not balanced for any of the three possible data states, the operator of the solitary algorithm can be applied to a third portion of the data programmed to the group of memory cells (e.g., to a third quantity of the data values of the codeword). That is, the operator can continue to be applied to additional portions of the data programmed to the group of memory cells (e.g., to different portions of the codeword) until the data is determined to be balanced for one of the three possible data states, at which point the Knuth algorithm can be applied to other two (e.g., the unbalanced) data states.

As an example, the first quantity of the data values of the codeword u can be expressed as the first i data values (e.g., components) of the codeword u:

$$u = u^{(0)} \to u^{(1)} \to u^{(2)} \to u^{(3)} \to \ldots \to u^{(i)} \to \ldots \to u^{(n-1)}$$

and the operator O of the solitary algorithm can be expressed as:

$$O(0) = 1, O(1) = 2, O(2) = 0$$

and expressing the weight w of a data state x as $w_x$, then starting from:

$$w(u^{(0)}) = (w_0, w_1, w_2),$$

after n−1 steps is reached:

$$w(u^{(n-1)}) = (w_2, w_0, w_1)$$

where $$w(u) \triangleq (w_0(u), w_1(U), w_2(u))$$

being $w_\alpha(u)$ the number of the occurrence of the data state $\alpha \in F_3$ in u, then the three sequences $w_0(u^{(i)})$, $w_1(u^{(i)})$, $w_2(u^{(i)})$ change at each i step no more than ±1. The single data state $\alpha$ that is the balanced data state can be identified according to:

If $\min\{w_0, w_2\} \leq m \leq \max\{w_0, w_2\}$, then $\alpha = 0$

If $\min\{w_1, w_0\} \leq m \leq \max\{w_1, w_0\}$, then $\alpha = 1$

If $\min\{w_2, w_1\} \leq m \leq \max\{w_2, w_1\}$, then $\alpha = 2$

Once $\alpha$ has been identified, i can be found starting from 0 and incrementing up to obtain:

$$w_\alpha(u^{(i)}) = m.$$

At this point, a data sequence v is obtained with the target weight for $\alpha$. Further, if $\overline{\alpha}$ is the set $\overline{\alpha} = F_3 - \{\alpha\} = \{\beta, \gamma\}$, from $x \in F_3^{3m}$ a vector can be obtained $y \in \overline{\alpha}^{2m} \subset f_3^{2m}$ by considering all the components of x different from $\alpha$, and y can be balanced using the Knuth algorithm with a Knuth index of j and binary symbols $0 = \min\{\beta, \gamma\}$ and $1 = \max\{\beta, \gamma\}$, obtaining the balanced version $z \in \overline{\alpha}^{2m}$, and the balanced codeword $v \in F_3^{3m}$ can be obtained replacing $y \in \overline{\alpha}^{2m}$ with $z \in \overline{\alpha}^{2m}$ in $x \in F_3^{3m}$. Further, the parity information (e.g., parity data) can be stored as the vector $r = (\alpha, i, j)$ for use in recovering the balanced codeword. The amount of data (e.g., quantity of memory cells) used to store the parity information can be given as:

$$1 + \lceil \log_3 3m \rceil + \lceil \log_3 2m \rceil$$

To decode the balanced data (e.g., recover the original codeword), an inversion of the operator of the solitary algorithm can be applied to all portions of the balanced data to which the operator was applied when balancing the data. Applying the inversion of the operator to these portions of the balanced data can change the data of these portions that is in second one of the three possible data states to the first one of the three possible data states, can change the data of these portions that is in the third one of the three possible data states to the second one of the three possible data states, and can change the data of these portions that is in the first one of the three possible data states to the third one of the three possible data states. For instance, each occurrence of data state 1 in these portions can be changed to data state 0, each occurrence of data state 2 in these portions can be changed to data state 1, and each occurrence of data state 0 in these portions can be changed to 0.

As an example, to obtain the original codeword u from v and r, the vector z (e.g., the non-$\alpha$ vector) can first be identified in v. The binary set $\overline{\alpha}$ (e.g., the first j components of z) can then be inverted, to obtain y. z can then be replaced with y in v to obtain x. The operator $O^{-1}$ can then be applied to the first i data values (e.g., components) of x to obtain u.

In an example in which the rotational mapping algorithm is a minimum-maximum algorithm, applying the minimum-maximum algorithm to the data programmed to the group of memory cells (e.g., the codeword) can comprise determining which one of the three possible data states is programmed to the greatest quantity of memory cells of the group (e.g., which data state has the greatest weight), and which one of the three possible data states is programmed to the lowest quantity of memory cells of the group (e.g., which data state has the lowest weight). The Knuth algorithm can then be applied to the data of the group programmed to the data state determined to have the greatest weight and the data of the group determined to have the lowest weight (e.g., but not to the data of the group programmed to the data state with the middle weight), which can balance the data state with the greatest weight (e.g., result in this data state having a weight of m). For example, if data state 0 is determined to have the greatest weight and data state 1 is determined to have the lowest weight, the Knuth algorithm can be applied to each occurrence of data states 0 and 1 in the group (e.g., but not to data state 2 in the group) to balance data state 0 (e.g., data states 1 and 2 would be the two data states not balanced by the minimum-maximum algorithm in this example).

The Knuth algorithm can then be applied to the data of the group of memory cells programmed to the two of the three possible data states that were not balanced by the minimum-mapping algorithm. For instance, the Knuth algorithm can then be applied to the data of the group programmed to the data state determined to have been programmed to the lowest quantity of memory cells of the group (e.g., the data state determined to have the lowest weight) and the data of the group programmed to the data state not determined to have been programmed to the greatest or lowest quantity of memory cells off the group (e.g., the data state with the middle weight on which the Knuth algorithm was not previously performed). Continuing in the previous example, the Knuth algorithm would then be applied to each occurrence of data states 1 and 2 in the group (e.g., but not to the balanced data state 0).

As an example, if $\beta \in \{0, 1, 2\}$ is the data state with the greatest weight, and $\beta + \Delta$ is the data state with the lowest weight, the Knuth algorithm can be applied to the codeword for data states $\beta$ and $\beta + \Delta$, with a target weight given by:

$$n_\beta^0 = m$$

such that the inversion operates between data states $\beta$ and $\beta + \Delta$, and data state $\beta + 2\Delta$ remains unchanged. The outcome of the Knuth algorithm is the Knuth index i, which can be a value between 0 and n=3m−1, and the final weight of $\beta$ in the codeword is m. The Knuth algorithm can then be applied to the codeword for data states $\beta+\Delta$ and $\beta+2\Delta$, with a target weight given by:

$$n_{\beta+1}^0 = n_{\beta+2}^0 = m$$

such that the inversion operates between data states $\beta+\Delta$ and $\beta+2\Delta$. The outcome of the Knuth algorithm is now the Knuth index j, which can be a value between 0 and 2m−1. The parity information (e.g., parity data) can be stored as the vector r=($\beta,\Delta$,i,j) for use in recovering the balanced codeword. The amount of data (e.g., quantity of memory cells) used to store the parity information can be given as:

$$2+\lceil \log_3 3m \rceil + \lceil \log_3 2m \rceil$$

To decode the balanced data (e.g., recover the original codeword), an inversion of the Knuth algorithm can be applied to the data of the balanced data in the data state that was determined to be programmed to the lowest quantity of memory cells of the group (e.g., the data of the balanced codeword in the data state that was determined to have the lowest weight) and the data of the balanced data in the data state not determined to be programmed to the greatest or lowest quantity of memory cells of the group (e.g., the data of the balanced codeword in the data state with the middle weight). For instance, the portion (e.g., sub-sequence) of the data of the balanced codeword in data states $\beta+\Delta$ and $\beta+2\Delta$ can be identified and inverted up to the Knuth index j. An inversion of the Knuth algorithm can then be applied to the data of the balanced data in the data state that was determined to be programmed to the greatest quantity of memory cells of the group (e.g., the data of the balanced codeword in the data state that was determined to have the greatest weight) and the data of the balanced data in the data state that was determined to be programmed to the lowest quantity of memory cells of the group (e.g., the data of the balanced codeword in the data state that was determined to have the lowest weight). For instance, the data of the codeword in data states $\beta$ and $\beta+\Delta$ can be identified and inverted up to the Knuth index i (e.g., the data in data state $\beta+2\Delta$ remains unchanged.

In an example in which the rotational mapping algorithm is a free-choice algorithm, applying the free-choice algorithm to the data programmed to the group of memory cells (e.g., the codeword) can comprise randomly selecting (e.g., arbitrarily choosing) one of the three possible data states, and applying an operator to a first portion of the data programmed to the group of memory cells (e.g., to a first quantity of the data values of the codeword). The operator can be the same operator previously described in connection with the solitary algorithm (e.g., applying the operator to the data can change the data in a manner analogous to that previously described in connection with the solitary algorithm).

After the operator of the free-choice algorithm is applied to the first portion of the data, it can be determined whether the data is balanced for the selected data state, or whether the operator has been applied to the first portion of the data 3m times. The determination of whether the data is balanced for the selected data state can be made in a manner analogous to that previously described in connection with the solitary algorithm. If it is determined that the data is balanced for the selected data state after the operator of the free-choice algorithm is applied to the first portion of the data, or that the operator has been applied to the first portion of the data 3m times, the Knuth algorithm can be applied to the data of the group programmed to the two non-selected data states.

If it is determined that the data is not balanced for the selected data state after the operator of the free-choice algorithm is applied to the first portion of the data, an additional operator can be applied to the first portion of the data. The additional operator can be an inversion of the first operator. For example, applying the additional operator to the first portion of the data can change the data of the first portion that is in the first one of the three possible data states to the third one of the three possible data states, can change the data of the first portion that is in the second one of the three possible data states to the first one of the three possible data states, and can change the data of the first portion that is in the third one of the three possible data states to the second one of the three possible data states. For instance, each occurrence of data state 0 in the first portion can be changed to data state 2, each occurrence of data state 1 in the first portion can be changed to data state 0, and each occurrence of data state 2 in the first portion can be changed to 1.

After the additional operator of the free-choice algorithm is applied to the first portion of the data, it can be determined whether the data is balanced for the selected data state, in a manner analogous to that previously described herein. If it is determined that the data is balanced for the selected data state after the additional operator of the free-choice algorithm is applied to the first portion of the data, the Knuth algorithm can be applied to the data of the group programmed to the two non-selected data states.

If it is determined that the data is not balanced for the selected data state after the additional operator of the free-choice algorithm is applied to the first portion of the data, the first operator of the free-choice algorithm can be applied to a second portion of the data programmed to the group of memory cells (e.g., to a second quantity of the data values of the codeword), in a manner analogous to that previously described herein. After the first operator of the free-choice algorithm is applied to the second portion of the data, it can be determined whether the data is balanced for the selected data state, or whether the operator has been applied to the second portion of the data 3m times, in a manner analogous to that previously described herein. If it is determined that the data is balanced for the selected data state after the operator of the free-choice algorithm is applied to the second portion of the data, or that the operator has been applied to the second portion of the data 3m times, the Knuth algorithm can be applied to the data of the group programmed to the two non-selected data states. If it is determined that the data is not balanced for the selected data state after the operator of the free-choice algorithm is applied to the second portion of the data, the additional (e.g., inversion) operator can be applied to the second portion of the data, in a manner analogous to that previously described herein.

After the additional operator of the free-choice algorithm is applied to the second portion of the data, it can be determined whether the data is balanced for the selected data state, in a manner analogous to that previously described herein. If it is determined that the data is balanced for the selected data state after the additional operator of the free-choice algorithm is applied to the second portion of the data, the Knuth algorithm can be applied to the data of the group programmed to the two non-selected data states. If it is determined that the data is not balanced for the selected data state, the operator and additional operator can continue to be applied to additional portions of the data programmed to the group of memory cells (e.g., to different portions of the codeword) until the data is determined to be balanced for one of the selected data state, at which point the Knuth algorithm can be applied to other two (e.g., the unbalanced) data states.

As an example, if $\beta \in \{0,1,2\}$ is the data state that is randomly selected, the operator O given by:

$$O(0)=1, O(1)=2, O(2)=0$$

can be applied to the codeword (e.g., the first portion of the codeword) until $\beta$ is balanced or the number of times the operator has been applied is equal to 3m. If $\beta$ is balanced, the Knuth algorithm can be applied; if $\beta$ is not balanced, the operator O' given by:

$$O'(0)=2, O'(1)=0, O'(2)=1$$

can be applied to the codeword until $\beta$ is balanced. The outcome of these operations can be the number of steps to balance $\beta$ index i, which can be a value between 0 and n=3m−1. The Knuth algorithm can then be applied to the codeword for the data states $\alpha \in \{0,1,2\} \neq \beta$ and $\varphi \in \{0,1,2\} | \varphi \neq \beta$ and $\varphi \neq \alpha$ until the weight:

$$n_\beta = n_\alpha = n_\varphi = m$$

The outcome of the Knuth algorithm can be the Knuth index j, which can be a value between 0 and n=3m−1. Further, the final weight of $\alpha$ and $\varphi$ in the codeword is m. The amount of data (e.g., quantity of memory cells) used to store the parity information can be given as:

$$2+\lceil \log_3 3m \rceil + \lceil \log_3 2m \rceil$$

To decode the balanced data (e.g., recover the original codeword), an inversion of the operator (e.g., the first operator) of the free-choice algorithm, or an inversion of the additional operator of the free-choice algorithm, can be applied to the data of the balanced data (e.g., to all portions of the balanced data to which the operator or additional operator was applied when balancing the data). For example, the inversion of the first operator of the free-choice algorithm can be applied if the data was balanced for the selected data state after the first operator was applied during the free-choice algorithm, and the inversion of the additional operator of the free-choice algorithm can be applied if the data was balanced for the selected data state after the additional operator was applied during the free choice algorithm.

Applying the inversion of the first operator to these portions of the balanced data can change the data of these portions that is in second one of the three possible data states to the first one of the three possible data states, can change the data of these portions that is in the third one of the three possible data states to the second one of the three possible data states, and can change the data of these portions that is in the first one of the three possible data states to the third one of the three possible data states. For instance, each occurrence of data state 1 in these portions can be changed to data state 0, each occurrence of data state 2 in these portions can be changed to data state 1, and each occurrence of data state 0 in these portions can be changed to 0. Applying the inversion of the additional operator to these portions of the balanced can change the data of these portions that is in the third one of the three possible data states to the first one of the three possible data states, can change the data of these portions that is in the first one of the three possible data states to the second one of the three possible data states, and can change the data of these portions that is in the second one of the three possible data states to the third one of the three possible data states. For instance, each occurrence of data state 2 in these portions can be changed to data state 2, each occurrence of data state 0 in these portions can be changed to data state 1, and each occurrence of data state 1 in these portions can be changed to 2.

As an example, the inversion of operator O or O' can be applied to the balanced codeword up to the relative index i, and the data states $\alpha$ and $\varphi$ in the codeword can be inverted up to the Knuth index i (e.g., the data in data state $\beta$ remains unchanged).

Although specific embodiments have been illustrated and described herein, those of ordinary skill in the art will appreciate that an arrangement calculated to achieve the same results can be substituted for the specific embodiments shown. This disclosure is intended to cover adaptations or variations of a number of embodiments of the present disclosure. It is to be understood that the above description has been made in an illustrative fashion, and not a restrictive one. Combination of the above embodiments, and other embodiments not specifically described herein will be apparent to those of ordinary skill in the art upon reviewing the above description. The scope of a number of embodiments of the present disclosure includes other applications in which the above structures and methods are used. Therefore, the scope of a number of embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
a memory having a group of memory cells, wherein each respective memory cell of the group is programmable to one of three possible data states; and
circuitry configured to balance data programmed to the group of memory cells between the three possible data states by:
determining whether the data programmed to the group of memory cells is balanced for any one of the three possible data states; and
upon determining the data programmed to the group of memory cells is not balanced for any one of the three possible data states:
apply a rotational mapping algorithm to the data programmed to the group of memory cells until the data is balanced for any one of the three possible data states; and
apply a Knuth algorithm to the data of the group of memory cells programmed to the two of the three possible data states that were not balanced by the rotational mapping algorithm.

2. The apparatus of claim 1, wherein the circuitry is configured to, upon determining the data programmed to the group of memory cells is balanced for any one of the three possible data states, apply the Knuth algorithm to the data of the group of memory cells programmed to the two of the three possible data states that were not determined to be balanced.

3. The apparatus of claim 1, wherein determining whether the data programmed to the group of memory cells is balanced for any one of the three possible data states comprises determining whether a quantity of the data of the group of memory cells programmed to any one of the three possible data states is at a target quantity.

4. The apparatus of claim 3, wherein:
the data programmed to the group of memory cells is determined to be not balanced for any one of the three possible data states if the quantity of the data of the group of memory cells programmed to each respective one of the three possible data states is not at the target quantity; and
the data programmed to the group of memory cells is determined to be balanced for any one of the three possible data states if the quantity of the data of the group of memory cells programmed to any one of the three possible data states is at the target quantity.

5. The apparatus of claim 3, wherein:
the quantity of the data of the group of memory cells programmed to a first one of the three possible data states is determined to be less than the target quantity;
the quantity of the data of the group of memory cells programmed to a second one of the three possible data states is determined to be greater than the target quantity;
the quantity of the data of the group of memory cells programmed to a third one of the three possible data states is determined to be less than or greater than the target quantity; and
applying the rotational mapping algorithm to the data programmed to the group of memory cells comprises:
changing the quantity of the data of the group of memory cells programmed to the first one of the three possible data states to be greater than the target quantity if the quantity of the data of the group of memory cells programmed to the third one of the three possible data states is determined to be greater than the target quantity; and
changing the quantity of the data of the group of memory cells programmed to the second one of the three possible data states to be less than the target quantity if the quantity of the data of the group of memory cells programmed to the third one of the three possible data states is determined to be less than the target quantity.

6. The apparatus of claim 1, wherein the rotational mapping algorithm comprises:
a solitary algorithm;
a minimum-maximum algorithm; or
a free-choice algorithm.

7. The apparatus of claim 1, wherein the circuitry is configured to:
store, in the memory, a quantity of the data of the group of memory cells that is changed during the balancing of the data; and
decode the balanced data using the stored quantity.

8. The apparatus of claim 1, wherein the circuitry is configured to decode the balanced data by applying an inversion of the rotational mapping algorithm to the balanced data.

9. The apparatus of claim 1, wherein the memory cells of the group are self-selecting memory cells in which a single material serves as a select element and a storage element, wherein the single material is a chalcogenide material.

10. A method of operating memory, comprising:
programming data to a group of memory cells, wherein each respective memory cell of the group is programmed to one of three possible data states; and
balancing the data programmed to the group of memory cells between the three possible data states by:
determining whether the data programmed to the group of memory cells is balanced for any one of the three possible data states; and
upon determining the data programmed to the group of memory cells is not balanced for any one of the three possible data states:
applying a solitary algorithm to the data programmed to the group of memory cells until the data is balanced for any one of the three possible data states; and
applying a Knuth algorithm to the data of the group of memory cells programmed to the two of the three possible data states that were not balanced by the solitary algorithm.

11. The method of claim 10, wherein applying the solitary algorithm to the data programmed to the group of memory cells comprises:
applying an operator to a first portion of the data programmed to the group of memory cells, wherein applying the operator to the first portion of the data:
changes the data of the first portion that is in a first one of the three possible data states to a second one of the three possible data states;
changes the data of the first portion that is in the second one of the three possible data states to a third one of the three possible data states; and
changes the data of the first portion that is in the third one of the three possible data states to the first one of the three possible data states; and
determining whether the data is balanced for any one of the three possible data states after applying the operator to the first portion of the data.

12. The method of claim 11, wherein applying the solitary algorithm to the data programmed to the group of memory cells comprises:
applying the operator to a second portion of the data programmed to the group of memory cells upon determining the data is not balanced for any one of the three possible data states after applying the operator to the first portion of the data, wherein applying the operator to the second portion of the data:
changes the data of the second portion that is in the first one of the three possible data states to the second one of the three possible data states;
changes the data of the second portion that is in the second one of the three possible data states to the third one of the three possible data states; and
changes the data of the second portion that is in the third one of the three possible data states to the first one of the three possible data states; and
determining whether the data is balanced for any one of the three possible data states after applying the operator to the second portion of the data.

13. The method of claim 11, wherein the method includes, upon determining the data is balanced for any one of the three possible data states after applying the operator to the first portion of the data, applying the Knuth algorithm to the data of the group of memory cells programmed to the two of the three possible data states that were not balanced after applying the operator to the first portion of the data.

14. The method of claim 11, wherein determining whether the data is balanced for any one of the three possible data states after applying the operator to the first portion of the data comprises:
  determining whether a target quantity is between a lower of a quantity of the data in the first data state and a quantity of the data in the third data state and a greater of the quantity of the data in the first data state and the quantity of the data in the third data state;
  determining whether the target quantity is between a lower of the quantity of the data in the first data state and a quantity of the data in the second data state and a greater of the quantity of the data in the first data state and the quantity of the data in the second data state; and
  determining whether the target quantity is between a lower of the quantity of the data in the second data state and the quantity of the data in the third data state and a greater of the quantity of the data in the second data state and the quantity of the data in the third data state.

15. The method of claim 11, wherein the method includes decoding the balanced data by applying an inversion of the operator to a first portion of the balanced data, wherein applying the inversion of the operator to the first portion of the balanced data:
  changes the data of the first portion of the balanced data that is in the second one of the three possible data states to the first one of the three possible data states;
  changes the data of the first portion of the balanced data that is in the third one of the three possible data states to the second one of the three possible data states; and
  changes the data of the first portion of the balanced data that is in the first one of the three possible data states to the third one of the three possible data states.

16. An apparatus, comprising:
  a memory having a group of memory cells, wherein each respective memory cell of the group is programmable to one of three possible data states; and
  circuitry configured to balance data programmed to the group of memory cells between the three possible data states by:
    determining whether the data programmed to the group of memory cells is balanced for any one of the three possible data states; and
    upon determining the data programmed to the group of memory cells is not balanced for any one of the three possible data states:
      apply a minimum-maximum algorithm to the data programmed to the group of memory cells until the data is balanced for any one of the three possible data states; and
      apply a Knuth algorithm to the data of the group of memory cells programmed to the two of the three possible data states that were not balanced by the minimum-maximum mapping algorithm.

17. The apparatus of claim 16, wherein applying the minimum-maximum algorithm to the data programmed to the group of memory cells comprises:
  determining which one of the three possible data states is programmed to a greatest quantity of memory cells of the group and which one of the three possible data states is programmed to a lowest quantity of memory cells of the group; and
  applying the Knuth algorithm to the data of the group of memory cells programmed to the one of the three possible data states determined to be programmed to the greatest quantity of memory cells of the group and the data of the group of memory cells programmed to the one of the three possible data states determined to be programmed to the lowest quantity of memory cells of the group.

18. The apparatus of claim 17, wherein applying the Knuth algorithm to the data of the group of memory cells programmed to the two of the three possible data states that were not balanced by the minimum-maximum mapping algorithm comprises applying the Knuth algorithm to the data of the group of memory cells programmed to the one of the three possible data states determined to be programmed to the lowest quantity of memory cells of the group and the data of the group of memory cells programmed to the one of the three possible data states not determined to be programmed to the greatest or lowest quantity of memory cells of the group.

19. The apparatus of claim 17, wherein the circuitry is configured to decode the balanced data by:
  applying an inversion of the Knuth algorithm to the data of the balanced data in the one of the three possible data states determined to be programmed to the lowest quantity of memory cells of the group and the data of the balanced data in the one of the three possible data states not determined to be programmed to the greatest or lowest quantity of memory cells of the group; and
  applying an inversion of the Knuth algorithm to the data of the balanced data in the one of the three possible data states determined to be programmed to the greatest quantity of memory cells of the group and the data of the balanced data in the one of the three possible data states determined to be programmed to the lowest quantity of memory cells of the group.

20. The apparatus of claim 16, wherein the three possible data states include:
  a first data state associated with a first threshold voltage distribution whose magnitude is greater for a first polarity than a second polarity;
  a second data state associated with a second threshold voltage distribution whose magnitude is greater for the second polarity than the first polarity; and
  a third data state associated with a third threshold voltage distribution whose magnitude is equal for the first polarity and the second polarity.

21. A method of operating memory, comprising:
  programming data to a group of memory cells, wherein each respective memory cell of the group is programmed to one of three possible data states; and
  balancing the data programmed to the group of memory cells between the three possible data states by:
    determining whether the data programmed to the group of memory cells is balanced for any one of the three possible data states; and
    upon determining the data programmed to the group of memory cells is not balanced for any one of the three possible data states:
      applying a free-choice algorithm to the data programmed to the group of memory cells until the data is balanced for any one of the three possible data states; and
      applying a Knuth algorithm to the data of the group of memory cells programmed to the two of the three possible data states that were not balanced by the free-choice algorithm.

22. The method of claim 21, wherein applying the free-choice algorithm to the data programmed to the group of memory cells comprises:
  randomly selecting one of the three possible data states;
  applying an operator to the data programmed to the group of memory cells, wherein applying the operator to the data:
    changes the data that is in a first one of the three possible data states to a second one of the three possible data states;
    changes the data that is in the second one of the three possible data states to a third one of the three possible data states; and
    changes the data that is in the third one of the three possible data states to the first one of the three possible data states; and
  determining whether the data is balanced for the selected one of the three possible data states after applying the operator to the data.

23. The method of claim 22, wherein applying the free-choice algorithm to the data programmed to the group of memory cells comprises:
  applying an additional operator to the data programmed to the group of memory cells upon determining the data is not balanced for the selected one of the three possible data states after applying the operator to the data, wherein applying the additional operator to the data:
    changes the data that is in the first one of the three possible data states to the third one of the three possible data states;
    changes the data that is in the second one of the three possible data states to the first one of the three possible data states; and
    changes the data that is in the third one of the three possible data states to the second one of the three possible data states; and
  determining whether the data is balanced for the selected one of the three possible data states after applying the additional operator to the the data.

24. The method of claim 22, wherein the method includes, upon determining the data is balanced for the selected one of the three possible data states after applying the operator to the data, applying the Knuth algorithm to the data of the group of memory cells programmed to the two of the three possible data states that were not selected.

25. The method of claim 21, wherein the method includes decoding the balanced data by applying an inversion of the operator to the balanced data, wherein applying the inversion of the operator to the balanced data:
  changes the data of the balanced data that is in the second one of the three possible data states to the first one of the three possible data states;
  changes the data of the balanced data that is in the third one of the three possible data states to the second one of the three possible data states; and
  changes the data of the balanced data that is in the first one of the three possible data states to the third one of the three possible data states.

26. The method of claim 21, wherein the group of memory cells comprises a codeword.

* * * * *